(12) United States Patent
Kobayashi et al.

(10) Patent No.: US 6,903,770 B1
(45) Date of Patent: Jun. 7, 2005

(54) DIGITAL CAMERA WHICH PRODUCES A SINGLE IMAGE BASED ON TWO EXPOSURES

(75) Inventors: Akio Kobayashi, Kyotanabe (JP); Hidefumi Okada, Daito (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/361,610

(22) Filed: Jul. 27, 1999

(30) Foreign Application Priority Data

Jul. 27, 1998 (JP) .......................................... 10-210963

(51) Int. Cl.⁷ .......................... H04N 3/14; H04N 5/335; H04N 5/225; H01L 27/00
(52) U.S. Cl. .................... 348/296; 348/312; 348/218.1; 250/208.1
(58) Field of Search .......................... 348/216.1, 218.1, 348/220.1, 294, 296, 299, 303, 311, 312, 314, 316, 322; 250/208.1

(56) References Cited

U.S. PATENT DOCUMENTS

| | | | | |
|---|---|---|---|---|
| 5,438,365 A | * | 8/1995 | Yamashita et al. | 348/312 |
| 5,463,421 A | * | 10/1995 | Deguchi et al. | 348/296 |
| 5,528,291 A | * | 6/1996 | Oda | 348/220.1 |
| 5,572,256 A | * | 11/1996 | Egawa et al. | 348/296 |
| 5,663,761 A | * | 9/1997 | Fukui | 348/312 |
| 5,917,546 A | * | 6/1999 | Fukui | 348/296 |
| 5,990,952 A | * | 11/1999 | Hamasaki | 348/311 |
| 6,130,420 A | * | 10/2000 | Tanaka et al. | 348/220.1 |
| 6,157,406 A | * | 12/2000 | Iura et al. | 348/220.1 |
| 6,369,796 B1 | * | 4/2002 | Numazaki et al. | 345/156 |
| 6,429,898 B1 | * | 8/2002 | Shoda et al. | 348/316 |
| 6,441,851 B1 | * | 8/2002 | Yonemoto | 348/294 |
| 6,628,332 B1 | * | 9/2003 | Watanabe | 348/322 |
| 6,661,451 B1 | * | 12/2003 | Kijima et al. | 348/220.1 |
| 6,744,471 B1 | * | 6/2004 | Kakinuma et al. | 348/216.1 |
| 6,801,257 B2 | * | 10/2004 | Segev et al. | 348/296 |

FOREIGN PATENT DOCUMENTS

| | | |
|---|---|---|
| JP | 62-108678 | 5/1987 |
| JP | 4-189082 | 7/1992 |
| JP | 4-207581 | 7/1992 |
| JP | 7-177433 | 7/1995 |
| JP | 8-84298 | 3/1996 |
| JP | 8-223488 | 8/1996 |
| JP | 8-331460 | 12/1996 |
| JP | 8-331461 | 12/1996 |
| JP | 9-322076 | 12/1997 |
| JP | 11-75118 | 3/1999 |

* cited by examiner

*Primary Examiner*—Tuan Ho
*Assistant Examiner*—John Villecco
(74) *Attorney, Agent, or Firm*—Armstrong, Kratz, Quintos, Hanson & Brooks, LLP.

(57) ABSTRACT

A digital camera includes a CCD imager having an interline transfer scheme. A first charge produced due to first exposure is read from light receiving elements positioned vertically intermittently. A second charge produced due to second exposure is also read from the same light receiving elements to vertical transfer regions. Here, the first charge is vertically moved simultaneously with or prior to reading out the second charge. The moving distance, at this time, is equal to or greater than a distance that the light receiving elements continue in the vertical direction. As a result of this, the second charge will not be mixed with the first charge. The first and second charges are subjected to a compositing process to display a composite image on an LCD.

4 Claims, 14 Drawing Sheets

| | | |
|---|---|---|
| V1 | G | |
| V8 | R →| ① |
| V7 | G | |
| V6 | R | |
| V5 | G →| ① |
| V4 | R | |
| V3 | G | |
| V2 | R | |
| V1 | G | |
| V8 | R →| ① |

(B)

| | | |
|---|---|---|
| | | |
| V8 | R →| ② ↓ |
| V7 | G | ① |
| V6 | R | |
| V5 | G →| ② ↓ |
| V4 | R | ① |
| V3 | G | |
| V2 | R | |
| V1 | G | |
| V8 | R →| ② |

FIG. 9

| | | LONG-TIME EXPOSURE | SGA | 2 LINE SHIFT | SHORT-TIME EXPOSURE | SGA | 1 LINE SHIFT | 1 LINE SHIFT | 1 LINE SHIFT |
|---|---|---|---|---|---|---|---|---|---|
| | | | T1 | T2 | | T3 | T4 | | |
| R4 | V2A | | | | | | | | |
| | V1 | | | | | | | | |
| | V3 | | | | | | | | |
| G4 | V2A | | | | | | | | |
| | V1 | | | | | | | | |
| | V3 | | | | | | | | |
| R3 | V2A | | R4L | | | R4S | R4S | R4S | |
| | V1 | | | | | | | | |
| | V3 | | | | | | | | |
| G3 | V2B | | G4L | | | G4S | G4S | G4S | R4S |
| | V1 | | | | | | | | |
| | V3 | | | | | | | | |
| R2 | V2A | | | R4L | | R4L | R4L | R4L | G4S |
| | V1 | | | | | | | | |
| | V3 | | | | | | | | |
| G2 | V2B | | | G4L | | G4L | G4L | R4L | G4L |
| | V1 | | | | | | | | |
| | V3 | | | | | | | | |
| R1 | V2A | | R2L | | | R2S | R2S | G4L | R4L |
| | V1 | | | | | | | | |
| | V2B | | | | | | | | |
| G1 | V1 | | G2L | | | G2S | G2S | R2S | G4L |
| | V3 | | | | R2L | R2L | R2L | G2S | R2S |
| | V2B | | | | G2L | G2L | G2L | R2L | G2S |

FIG. 10

| | | LONG-TIME EXPOSURE | SGA | 2 LINE SHIFT T2 | SHORT-TIME EXPOSURE | SGA T3 | 1 LINE SHIFT T4 | 1 LINE SHIFT | 1 LINE SHIFT |
|---|---|---|---|---|---|---|---|---|---|
| G4 | V1 | | | | | | | | |
| | V3 | | G4L | | | G4S | | | |
| | V2A | | | | | | | | |
| B4 | V1 | | | | | | | | |
| | V3 | | B4L | | | B4S | G4S | G4S | |
| | V2A | | | | | | | | |
| G3 | V1 | | | | | | | | |
| | V3 | | | G4L | | G4L | B4S | B4S | G4S |
| | V2B | | | | | | | | |
| B3 | V1 | | | | | | | | |
| | V3 | | | B4L | | B4L | G4L | G4L | B4S |
| | V2B | | | | | | | | |
| G2 | V1 | | | | | | | | |
| | V3 | | G2L | | | G2S | B4L | B4L | G4L |
| | V2A | | | | | | | | |
| B2 | V1 | | | | | | | | |
| | V3 | | B2L | | | B2S | G2S | G2S | B4L |
| | V2A | | | | | | | | |
| G1 | V1 | | | | | | | | |
| | V3 | | | G2L | | G2L | B2S | B2S | G2S |
| | V2B | | | | | | | | |
| B1 | V1 | | | | | | | | |
| | V3 | | | B2L | | B2L | G2L | G2L | B2S |
| | V2B | | | | | | | | |

DIGITAL CAMERA WHICH PRODUCES A SINGLE IMAGE BASED ON TWO EXPOSURES

BACKGROUND OF THE INVENTION

1. Field of the Invention

This invention relates to digital cameras and, more particularly, to a digital camera which can create one screen of image signals based on a first charge (first camera signal) produced due to first exposure by a CCD imager and a second charge (second camera signal) due to second exposure of the CCD imager.

2. Description of the Related Art

A digital camera employs an image sensor, such as a CCD imager, to shoot a subject. If the CCD imager is given a subject image in front thereof, light receiving elements produce electric charges in proportion to the amount of light through photoelectric conversion. The charges thus produced are outputted through the vertical and horizontal transfer registers. By performing a predetermined signal process on these charges (camera signal), a subject image is reproduced on a monitor. The subject image is also recorded to a memory medium.

However, there is a limitation in the charge amount to be stored on the light receiving elements. Consequently, if the subject image has an extremely-high light quantity area (bright area), saturation of charge possibly occurs in such an area. Thus, in the conventional digital camera there has been a limitation in the dynamic range for a shot subject image.

SUMMARY OF THE INVENTION

It is therefore a primary object of the present invention to provide a digital camera having a dynamic range to be broadened for a taken subject image.

A digital camera according to the present invention, comprises: a CCD imager having light receiving elements vertically and horizontally arranged respectively in a first predetermined number and a second predetermined number, and including the second predetermined number of vertical transfer registers each having the first predetermined number of transfer regions and a horizontal transfer register connected to output ends of the vertical transfer registers; a timing generator connected to the CCD imager to supply predetermined timing signals to the CCD imager, the predetermined timing signals including a first exposure signal to perform first exposure for a first predetermined period, a first read signal to read a first charge created due to the first exposure from first light receiving elements positioned vertically intermittently to the vertical transfer registers, a charge moving signal to move the first charge to vacant transfer regions of the vertical transfer registers, a second exposure signal to perform second exposure for a second predetermined period different from the first predetermined period, a second read signal to read a second charge created due to the second exposure from second light receiving elements positioned vertically intermittently to the vertical transfer registers, a first vertical transfer signal to vertically transfer the first charge and the second charge on the vertical transfer registers, and a first horizontal transfer signal to horizontally transfer the first charge and the second charge to the horizontal transfer register; a first processor connected to the CCD imager and creating one screen of a first image signal based on the first charge and the second charge that have been outputted from the horizontal transfer register.

According to the present invention, the CCD imager has light receiving elements vertically in a first predetermined number and horizontally in a second predetermined number, and includes the second predetermined number of vertical transfer registers each having the first predetermined number of transfer region and a horizontal transfer register connected to output ends of the vertical transfer registers. The timing generator supplies predetermined timing signals to the CCD imager.

First exposure for a first predetermined period is effected by a first exposure signal. The first charge produced by the first exposure is read by a first read signal from the first light receiving elements positioned vertically intermittently to the vertical transfer registers. The first charge thus read is moved to vacant transfer regions of the vertical transfer registers by a charge moving signal. Second exposure for a second predetermined period different from the first predetermined period is effected by a second exposure signal. A second charge produced due to the second exposure is read by a second read signal from the second light receiving elements positioned vertically intermittently to the vertical transfer registers. The first and second charges thus read on the vertical transfer registers are vertically transferred by a first vertical transfer signal, being delivered to the horizontal transfer register. The first and second charges given to the horizontal transfer register are thereafter horizontally transferred by a first horizontal transfer signal.

The first processor creates one screen of a first image signal based on the first and second charges thus outputted from the horizontal transfer register.

Because one screen of an image signal is created on a first change produced due to a first exposure for a first predetermined period and a second charge due to a second exposure, the dynamic range for the shot image can be broadened.

According to one embodiment, the first light receiving elements and the second light receiving elements are the same light receiving elements. Also, the charge moving signal is a signal to move the first charge simultaneously with or prior to reading out the second charge. Here, the moving distance of the first charge is greater than a distance that the first light receiving elements vertically continue. When the first light receiving elements of N (N≧1) in number exist vertically intermittently for each, the first charge moves over at least a distance corresponding to the first light receiving elements of N in number.

In another embodiment of the present invention, an image corresponding to the first image signal is displayed on the monitor connected to the first processor.

In one aspect of the invention, when a shutter button is operated, a third exposure signal is outputted from the timing generator. As a result, third exposure is effected for a third predetermined period. A third charge produced as a result of the third exposure is read from all the light receiving elements to the vertical transfer registers by a third read signal. The third charge read to the vertical transfer register is vertically transferred by a second vertical transfer signal to the horizontal transfer register. The third charge on the horizontal transfer register is thereafter horizontally transferred by a second horizontal transfer signal.

After the third exposure, a fourth exposure signal is outputted from the timing generator, thereby starting fourth exposure. Elapsing a fourth predetermined period, a shutter member is driven by a drive signal whereby light incidence onto the CCD imager is blocked off by the shutter member. That is, the fourth exposure ends by a mechanical shutter scheme. A fourth charge produced as a result of the fourth exposure, after completing vertical transfer of the third charge, is read from all the light receiving elements to the vertical transfer registers by a fourth read signal. The fourth charge read to the vertical transfer registers is then vertically transferred by a third vertical transfer signal to the horizontal transfer register. The fourth charge on the horizontal transfer register is thereafter horizontally transferred by a third horizontal transfer signal, thus being outputted to the CCD imager.

A second processor creates one screen of a second image signal based on the third and fourth charges outputted from the CCD imager. The created second image signal is thereafter recorded in a compression state to a recording medium.

A digital camera according to the present invention, comprises: a CCD imager having light receiving elements vertically and horizontally arranged respectively in a first predetermined number and a second predetermined number, and including the second predetermined number of vertical transfer registers each having the first predetermined number of transfer regions and a horizontal transfer register connected to output ends of the vertical transfer registers; a first exposure means for giving first exposure or first predetermined period to the CCD imager; a first read means for reading a first charge created due to the first exposure from first light receiving elements positioned vertically intermittently to the vertical transfer registers; a charge moving means for moving the first charge to vacant transfer regions of the vertical transfer registers; a second exposure means for giving second exposure to the CCD imager for a second predetermined period different from the first predetermined period; a second read means for reading second charge created due to the second exposure from second light receiving elements positioned vertically intermittently to the vertical transfer registers; a first vertical transfer means for vertically transferring the first charge and the second charge over the vertical transfer registers; a horizontal transfer means for horizontally transferring the first charge and the second charge given to the horizontal transfer register; and a first image signal creating means for creating one screen of a first image signal based on the first charge and the second charge that have been outputted from the horizontal transfer register.

According to the present invention, a CCD imager has light receiving elements vertically and horizontally arranged respectively in a first predetermined number and a second predetermined number, and includes the second predetermined number of vertical transfer registers each having the first predetermined number of transfer regions and a horizontal transfer register connected to output ends of the vertical transfer registers. The first exposure means causes the CCD imager thus structured to effect first exposure for a first predetermined period. The first read means reads the first charge produced due to the first exposure from the first light receiving elements positioned vertically intermittently to the vertical transfer registers. The first charge thus read is moved to vacant transfer regions of the vertical transfer registers by the charge moving means.

On the other hand, the second exposure means causes the CCD imager to effect second exposure for a second predetermined period different from the first predetermined period. The second read means reads the second charge produced as a result of the second exposure from the second light receiving elements positioned vertically intermittently to the vertical transfer registers. The first and second charges thus read to the vertical transfer registers are vertically transferred by the first vertical transfer means. The first and second charges when delivered to the horizontal transfer register are horizontally transferred by the first transfer means. The first image signal creating means creates one screen of a first image signal based on the first and second charges outputted from the horizontal transfer register.

Because one screen of an image signal is created based on the first charge produced as a result of the first exposure for the first predetermined period and the second charge as a result of the second exposure for the second predetermined period, the dynamic range can be broadened for a shot image.

In one embodiment of the present invention, the first light receiving elements and the second light receiving elements are the same light receiving elements. The charge moving means moves the first charge simultaneous with or prior to reading out the second charge. Here, the first charge has a moving distance greater than a distance that the first light receiving elements vertically continue. That is, when the first light receiving elements of N (N≧1) in number exist vertically intermittently for each, the first charge moving over at least a distance corresponding to the first light receiving elements of N in number.

In another embodiment of the present invention, the first exposure means and the second exposure means are of an electronic shutter scheme to provide the first exposure and the second exposure.

In still another embodiment of the present invention, an image corresponding to the first image signal is displayed on a monitor.

In one aspect of the present invention, when a shutter button is operated, a third exposure is effected for a third predetermined period by a third exposure means. The third charge produced as a result of the third exposure is read from all the light receiving elements to the vertical transfer registers by a third read means, and thereafter vertically transferred by a second transfer means. When the third charge is delivered by vertical transfer to the horizontal transfer register, a second horizontal transfer means horizontally transfers the third charge. A fourth exposure means effects fourth exposure after the third exposure. Elapsing a fourth predetermined period from a start of the fourth exposure, a drive means drives a shutter member. As a result of this, light incident onto the CCD imager is blocked off, thus ending the fourth exposure.

The fourth charge produced as a result of the fourth exposure, after completing vertical transfer of the third charge, is read by a fourth read means from all the light receiving elements to the vertical transfer registers. The read charge is vertically transferred to the horizontal transfer register by a third vertical transfer means. The fourth charge delivered to the horizontal transfer register is thereafter horizontally transferred by a third horizontal transfer means. A second image signal creating means creates one screen of a second image signal based on the third and fourth charges outputted from the horizontal transfer registers. The created second image signal is recorded in a compression state to a recording medium by a recording means.

The above described objects and other objects, features, aspects and advantages of the present invention will become more apparent from the following detailed description of the present invention when taken in conjunction with the accompanying drawings.

BRIEF DESCRIPTION OF THE DRAWINGS

FIG. 5 is an illustrative view showing one part of operation in the camera mode of the FIG. 1 embodiment;

FIG. 9 is an illustrative view showing one part of operation in a camera mode of the FIG. 7 embodiment;

FIG. 10 is an illustrative view showing another part of operation in the camera mode of the FIG. 7 embodiment;

DETAILED DESCRIPTION OF THE PREFERRED EMBODIMENTS

Figure 1:
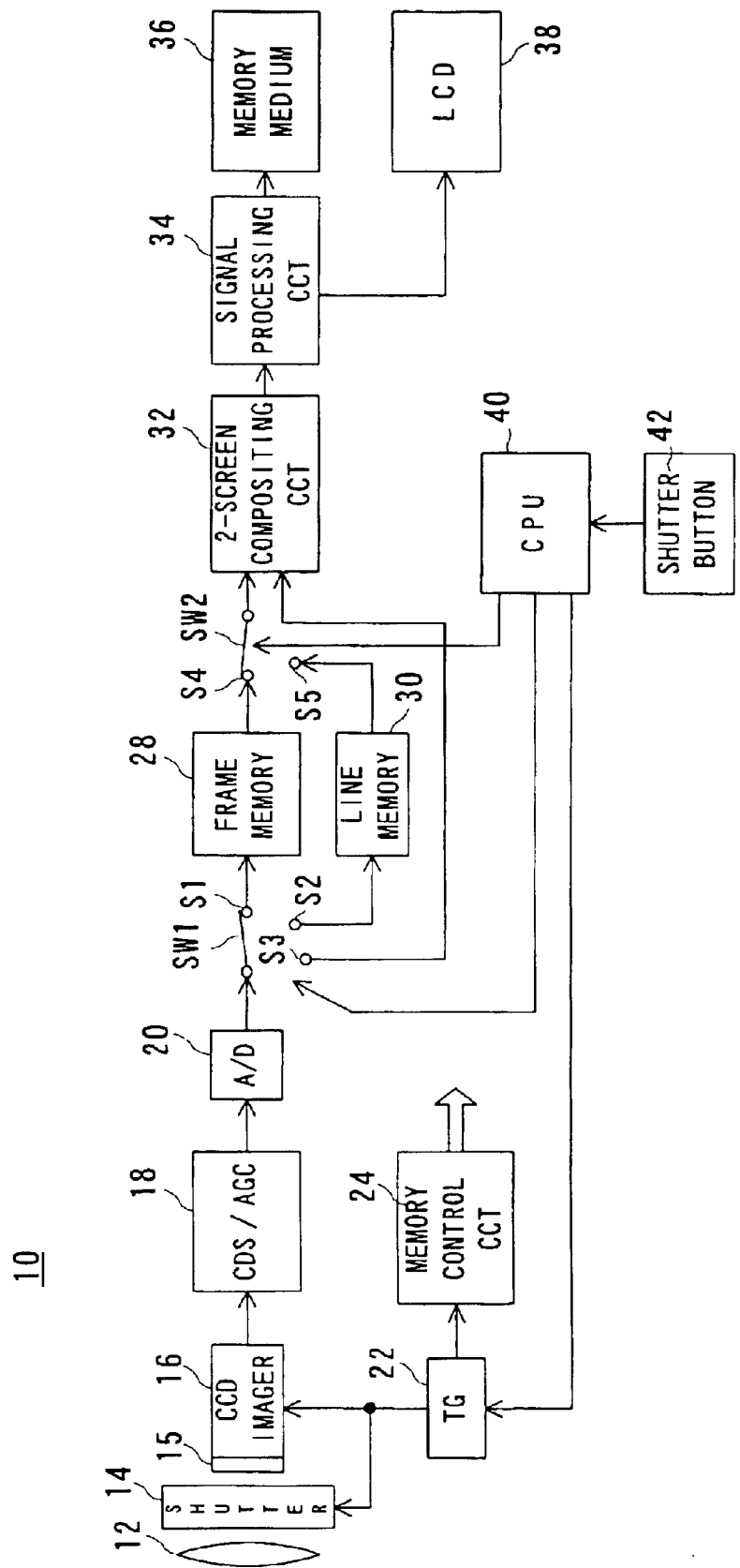
FIG. 1 is a block diagram showing one embodiment of the present invention.

Referring to FIG. 1, a digital camera 10 of this embodiment includes an optical lens 12 and a shutter member 14 that mechanically operates to block off incoming light. A subject image is given through the optical lens 12 and shutter member 14 to a CCD imager 16 of an interline transfer scheme. The CCD imager 16, with a resolution of XGA, includes pixels arranged in the number of "horizontally 1280" and vertically "960".

Figure 2:
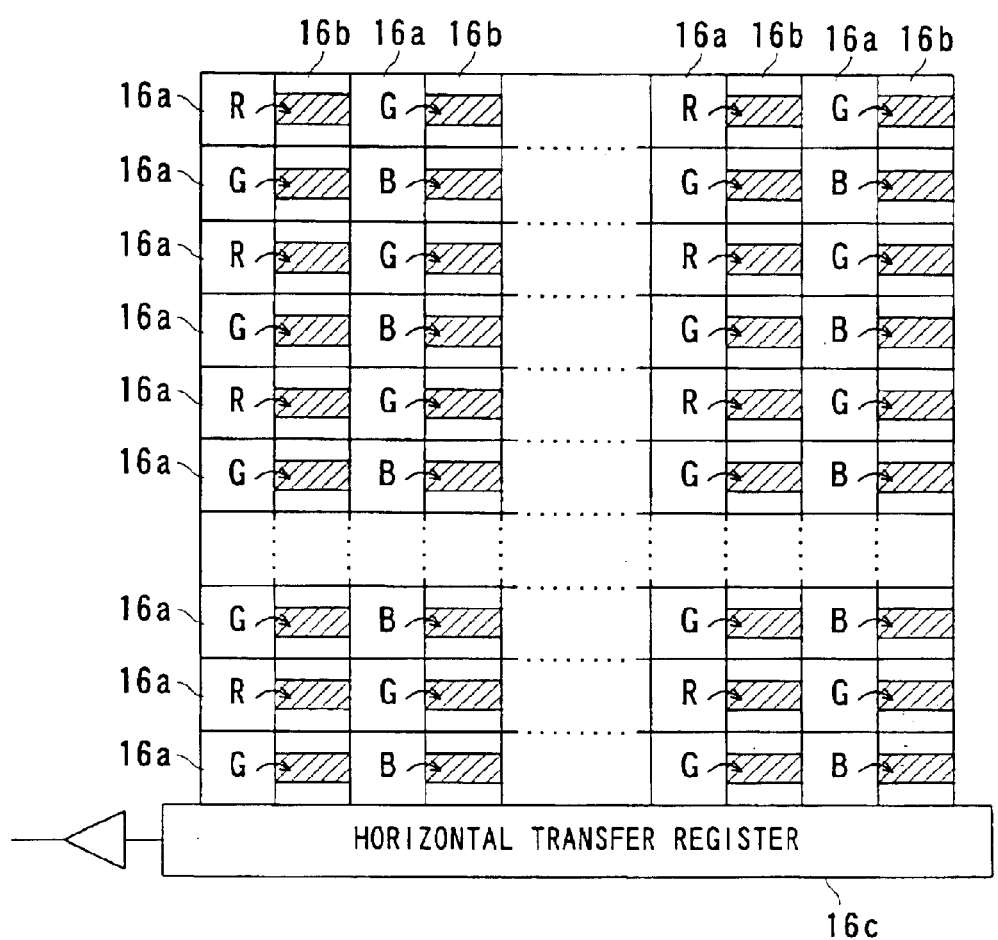
FIG. 2 is an illustrative view showing a CCD imager applied to the FIG. 1 embodiment.

The CCD imager 16 is formed with a plurality of light receiving elements 16a, as shown in FIG. 2. The light receiving elements 16a have, in front, a primary color filter 15 having filter elements of R, G and B arranged in a mosaic form. The light receiving elements 16a constitute pixels for the CCD imager 16, wherein each light receiving element 16a corresponds to any of the filter elements. The subject image is passed through the primary color filter 15 formed as above to the light receiving elements 16a for photoelectric conversion.

The charge thus photoelectrically converted by the light receiving element 16a is read onto a vertical transfer register 16b. The vertical transfer registers 16b are arranged in number of horizontally 1280. Each vertical transfer registers 16b is formed by a plurality of metals. Three metals correspond to one light receiving element 16a, and the three metals form one transfer region. During charge reading, the potential on a central metal is decreased, shown by hatching, of the three metals forming one transfer region. As a result of this, the charge stored on each light receiving element 16a can be read onto a vertical transfer register 16b without being mixed with the charge of other elements. The charge thus read is vertically transferred without being mixed with the charges of other elements, by varying the potentials on the metals. The vertical transfer registers 16b have their output ends connected with a horizontal transfer register 16c. The horizontal transfer register 16c, each time 1 line of charge is inputted from each vertical transfer register 16b, transfers the same charge in the horizontal direction. In this manner, the charges stored on the light receiving elements 16a are outputted line-by-line as a camera signal.

The charge accumulated on the light receiving element 16a is read onto the vertical transfer register 16b in response to a charge reading pulse XSG, and the read charge is then transferred to the horizontal transfer register 16c in response to a vertical transfer pulse XV1. The charge delivered to the horizontal transfer register 16c is outputted to an outside in response to a horizontal transfer pulse XH1. Meanwhile, the charge accumulated on the light receiving element 16a during a non-exposure period is swept out to an overflow drain (not shown) due to a charge sweep pulse XSUB. These pulses are outputted from timing generator (TG) 22 connected to the CCD imager 16. These pulses are controlled in output timing by a CPU 40 whereby exposure time and the number of pixels in an output camera signal are varied. Incidentally, the method of controlling exposure with the charge sweep pulse XSUB or charge read pulse XSG is a well-known technique called electronic shutter.

Figure 4:
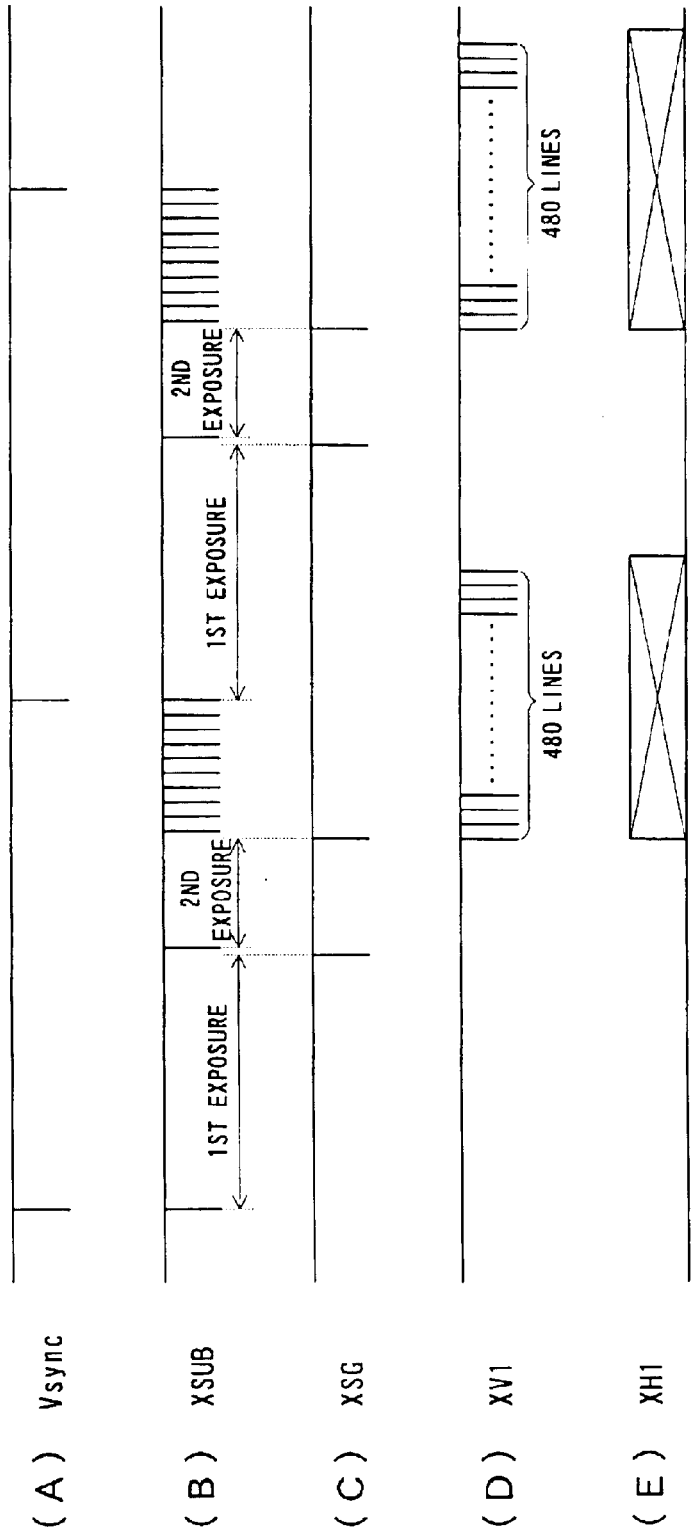
FIG. 4 is a timing chart showing one part of operation in a camera mode of the FIG. 1 embodiment.

In a camera mode in order to display motion images real time on an LCD 38, a charge sweep pulse XSUB, a charge read pulse XSG, a vertical transfer pulse XVI and a horizontal transfer pulse XH1 are outputted in timing shown in FIGS. 4(B)–(C) with respect to a vertical synchronizing signal Vsync shown in FIG. 4(A). First, in synchronism with a vertical synchronizing signal Vsync a charge sweep pulse XSUB is outputted to sweep away all the charges accumulated on the light receiving element 16a. From this time, first exposure is started and newly produced charges are accumulated on the light receiving element 16a. Elapsing a predetermined time, a charge read pulse XSG is outputted and the charges accumulated on a predetermined light receiving element 16a 5 are read onto the vertical transfer register 16b.

The LCD 38 has a resolution of VGA. In the camera mode, a camera signal of 1280 pixels×140 lines provides creation of a display image of 640 pixels×480 lines. As a result of this, in the case that 8 lines are taken as 1 unit to assign VI–V8 to each line, the charge ① accumulated on the lines V5 and V8 is read out. In this manner, when the charge ① of 1280 pixels×140 lines has been read out, the first exposure is ended.

Referring back to FIG. 4, immediately after ending the first exposure, a charge sweep pulse XSUB is outputted to start second exposure from this time. Elapsing a predetermined time, a charge read pulse XSG as identical to the first exposure is again outputted to read out charges of 1280 pixels×140 lines from the same light receiving element 16a as in the first exposure. At this time, the second exposure is ended. If the second exposure is ended, charge sweep pulses XSUB are repeatedly outputted until a next first exposure is started, consecutively sweeping away the charges accumulated on the light receiving element 16a.

The vertical charge transfer as a result of the vertical transfer pulse XVI and horizontal charge transfer as a result of the horizontal transfer pulse XH1 are started simultaneously with reading out the charges obtained by the second exposure. In the camera mode only 240 lines are used that is, ¼ of 960 lines of light receiving elements 16a, leaving a vacant transfer region of 720 lines to the vertical transfer register 16b. As a result of this, as shown in FIG. 5(B), the charge ① based on the first exposure is vertically moved simultaneously with reading out the charge ② based on the second exposure.

The light receiving element 16a to be read out are intermittently positioned one-by-one with respect to the vertical direction, and the moving distance of the charge ①
is at least a distance between adjacent light receiving elements 16a. As a result of this, the charge ① moves to a
transfer region (vacant transfer region) corresponding to a
light receiving element 16a now not to be read out. At a time
point that the charge ② is read out, the charges ① and ②
exist on every other line without being mixed with each
other. The charges ① and ② are vertically transferred in
this state and then horizontally transferred through the
horizontal transfer register 16c. Through the horizontal
transfer register 16c the charge ① (first camera signal) and
the charge ② (second camera signal) are alternately outputted line-by-line.

Referring to FIG. 1, the first camera signal and the second
camera signal outputted from the CCD imager 16 are
subjected to well-known noise removal and level adjustment
by a CDS/AGC circuit 18, and then converted into first
camera data and second camera data by an A/D converter 20.

In the camera mode, a switch SW1 is switched between
a terminal S2 and a terminal S3 at a time interval of 1-line
period. Also, a switch SW2 is connected to a terminal S5.
Both the switches SW1 and SW2 are controlled by a CPU
40. The first camera data and the second camera data coexist
every line. Consequently, a 2-screen composting circuit 32
is inputted by the first camera data with 1-line delay through
a line memory 30 and the second camera data without delay.
That is, the first camera data and second camera data on a
same line are simultaneously inputted to the 2-screen compositing circuit 32. Incidentally, the writing to and reading
from the line memory 30 are controlled by a memory control
circuit 24.

The 2-screen compositing circuit 32 selects a signal
having a brightness satisfying a predetermined condition
from the simultaneously-inputted first and second camera
data. In this embodiment, the first exposure time is greater
than the second exposure time, and, accordingly, the second
camera data is employed for a subject high brightness
portion while the first camera data is for a low brightness
portion. In this manner, composite camera data is created
having 1280 pixels×240 lines that is broadened in dynamic
range in a pseudo fashion. The composite camera data is
thereafter subjected to YUV conversion, thinning-out, interpolation and the like by a signal processing circuit 34, and
thereby created into image data having 640 pixels×480 lines.
The created image data is outputted into the LCD 38. As a
result, real time motion pictures (through pictures) are
displayed.

Figure 6:
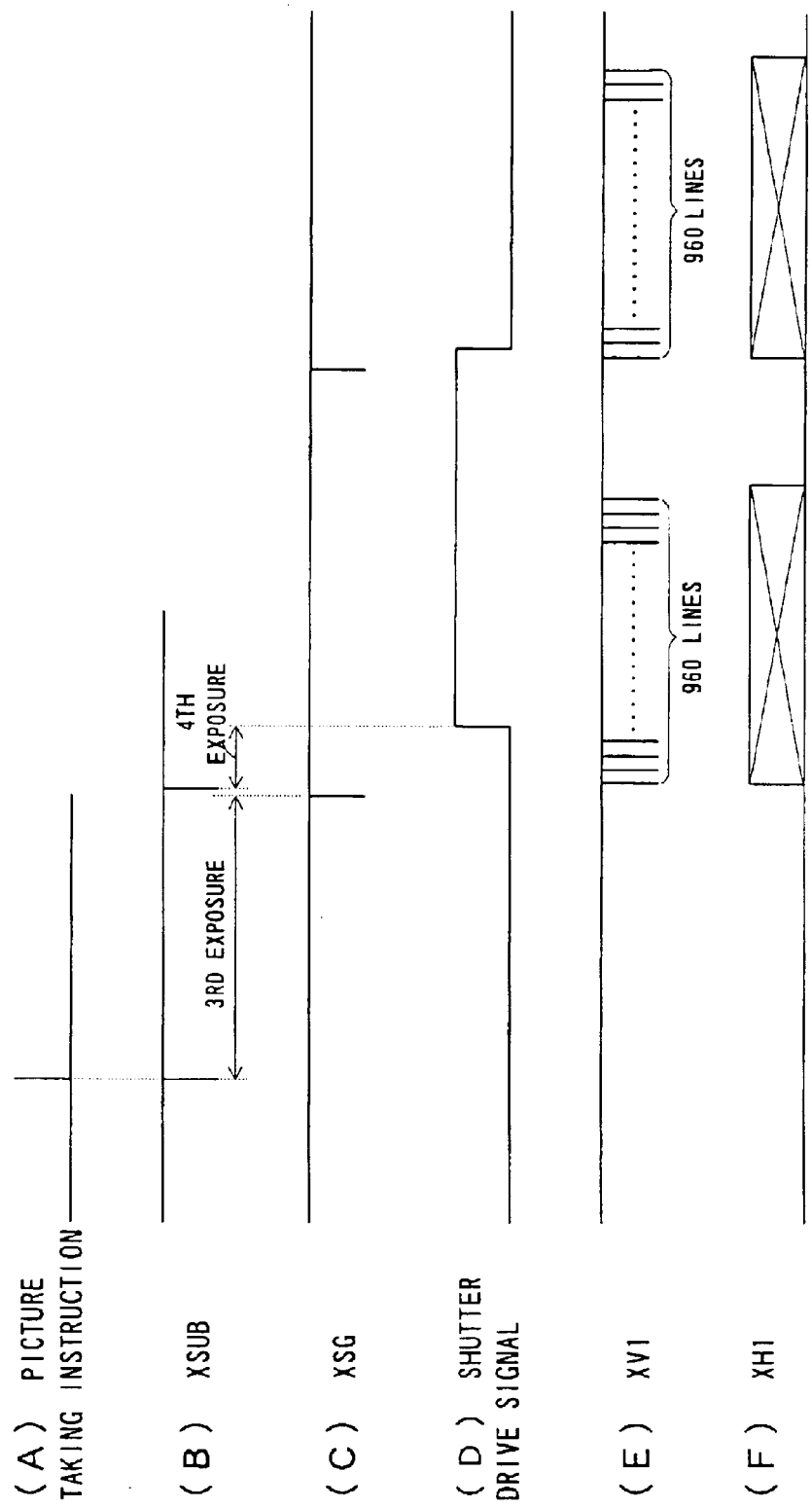
FIG. 6 is a timing chart showing one part of operation of the FIG. 1 embodiment when a shutter button is pressed.

If an operator manipulates a shutter button 42, the CPU 40
supplies to the TG 22 a picture taking instruction signal
shown in FIG. 6(A). The TG 22, in turns, outputs a charge
sweep pulse XSUB, a charge read pulse XSG, a shutter drive
signal, a vertical transfer pulse XV1 and a horizontal transfer
pulse XH1 respectively shown in FIGS. 6(B)–(F).

That is, nearly simultaneously with a picture taking
instruction, a charge sweep pulse XSUB is outputted almost
simultaneously with the picture taking instruction, to start
third exposure. Elapsing a predetermined period, a charge
read pulse XSG is outputted to read charges of 1280
pixels×960 lines from all the light receiving elements 16a
onto the vertical transfer registers 16b. At this time, the third
exposure is ended. When the shutter button 42 is operated,
charges are read from all the light receiving elements 16a.
Accordingly, no vacant areas are formed on the vertical
transfer registers 16b, differently from the camera mode. A
vertical transfer pulse XV1 and horizontal transfer pulse
XH1 are outputted immediately after ending the third exposure. The third charge, or third camera signal, read out onto
the vertical transfer registers 16b is promptly outputted
through the horizontal transfer register 16c.

Immediately after outputting a charge read pulse XSG, a
charge sweep pulse XSUB is outputted to start fourth
exposure nearly simultaneously with the start of vertical
transfer. Elapsing a predetermined time from a start of the
fourth exposure, a shutter drive signal rises to drive a shutter
member 14. As a result of this, incident light is blocked off,
thus ending the fourth exposure. In this manner, third
exposure starting and ending as well as fourth exposure
starting are controlled by an electronic shutter scheme.
However, fourth exposure ending is controlled by a
mechanical shutter scheme.

With a mechanical shutter scheme, the incidence of light
onto the CCD imager 16 is actually blocked off by the
shutter member 14 arranged in front of the CCD imager 16.
Accordingly, there is no need to read out charges immediately after elapsing an exposure period. Thus, even after
closure of the shutter member 14, the charges are held on the
light receiving elements 16a. After completing vertical and
horizontal transfer of the third charge based on third
exposure, a charge read pulse XSG is outputted. As a result
of the charge read pulse XSG, a fourth charge of 1280
pixels×960 lines based on fourth exposure is read out of the
light receiving elements 16a. Because after completing the
reading out, the shutter member 14 is no longer required to
be closed, the shutter drive signal is fallen to open the shutter
member 14. Meanwhile, immediately after reading the third
charge out of the light receiving elements 16a, a vertical
transfer pulse XVI and horizontal transfer pulse XH1 are
outputted. Thus, a fourth charge, i.e., fourth camera signal,
based on fourth exposure is outputted.

In this manner, when the shutter button 42 is operated, a
third camera signal and a fourth camera signal are individually outputted from the CCD imager 16. The output third
camera signal and fourth camera signal are respectively
converted into third camera data and fourth camera data
through the processing of CDS/AGC, similarly to the above.
The CPU 40 causes the switch SW1 to connect to the
terminal SI when third camera data is outputted from the
A/D converter 20. The third camera data is written onto the
frame memory 28 by the memory control circuit 24. When
all the third camera data is written onto the frame memory
28, the CPU causes the switch SW1 to connect to the
terminal S3. Accordingly, the fourth camera data to be
outputted following the third camera data from the A/D
converter 20 is directly inputted to the 2-screen compositing
circuit 32.

The 2-screen compositing circuit 32 composites together
the third camera data and the fourth camera data in a manner
similar to the above, thereby creating composite camera data
having 1280 pixels×960 lines that is broadened in dynamic
range in a pseudo fashion. The signal processing circuit 34
performs YUV conversion on the composite camera data
and compresses the resulting YUV data by a JPEG scheme.
The compressed image data is then recorded in a recording
media 36.

Figure 3:
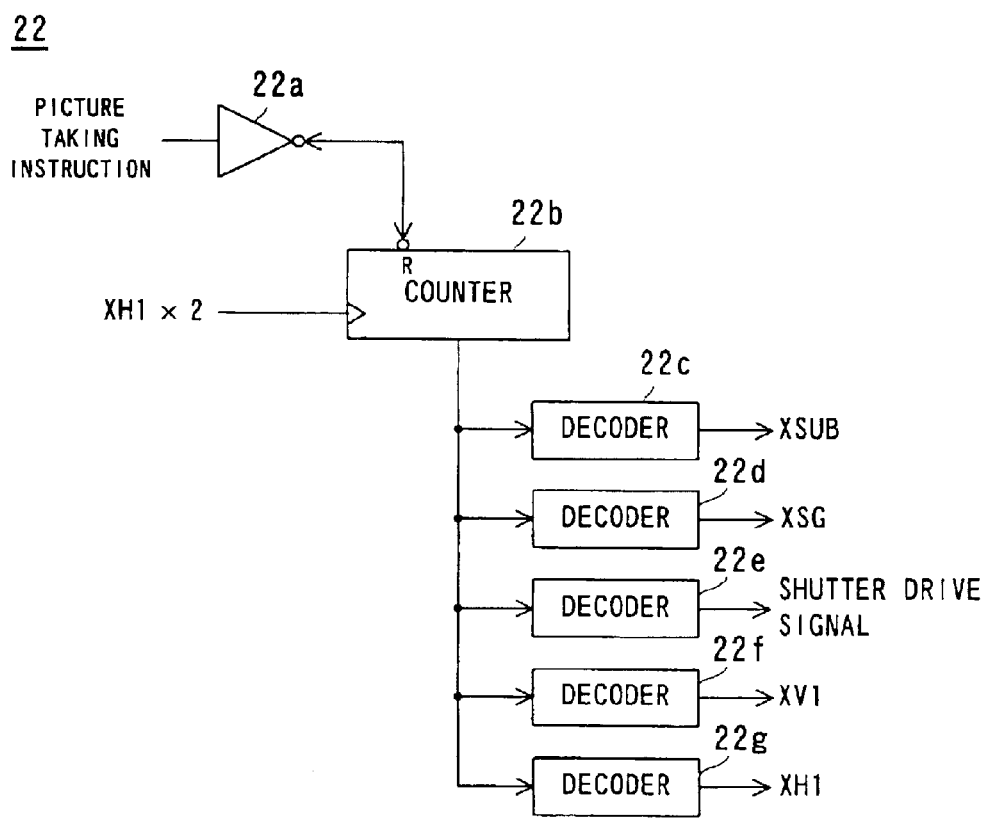
FIG. 3 is a block diagram showing one part of a timing generator applied to the FIG. 1 embodiment.

Now explained in detail will be the operation of TG 22
responsive to shutter button 42 operation with reference to
FIG. 3. A picture taking instruction signal is supplied to a
reset terminal of a counter 22b through an inverter 22a,
thereby resetting a counter 22b. Meanwhile, a clock twice
the horizontal transfer pulse XH1 is given to a clock terminal
of the counter 22b, whereby a count value is incremented by
this clock. The count value thus given is inputted to decoders 22c–22g. The recorders 22c–22g respectively produce a charge sweep pulse XSUB, a charge read pulse XSG, a shutter drive signal, a vertical transfer pulse XV1 and a horizontal transfer pulse XH1 shown in FIGS. 6(B)–(F), in response to the count value input. That is, the decoders 22c–22g are enabled by the CPU 40 responsive to an operation of the shutter button 42.

Figure 7:
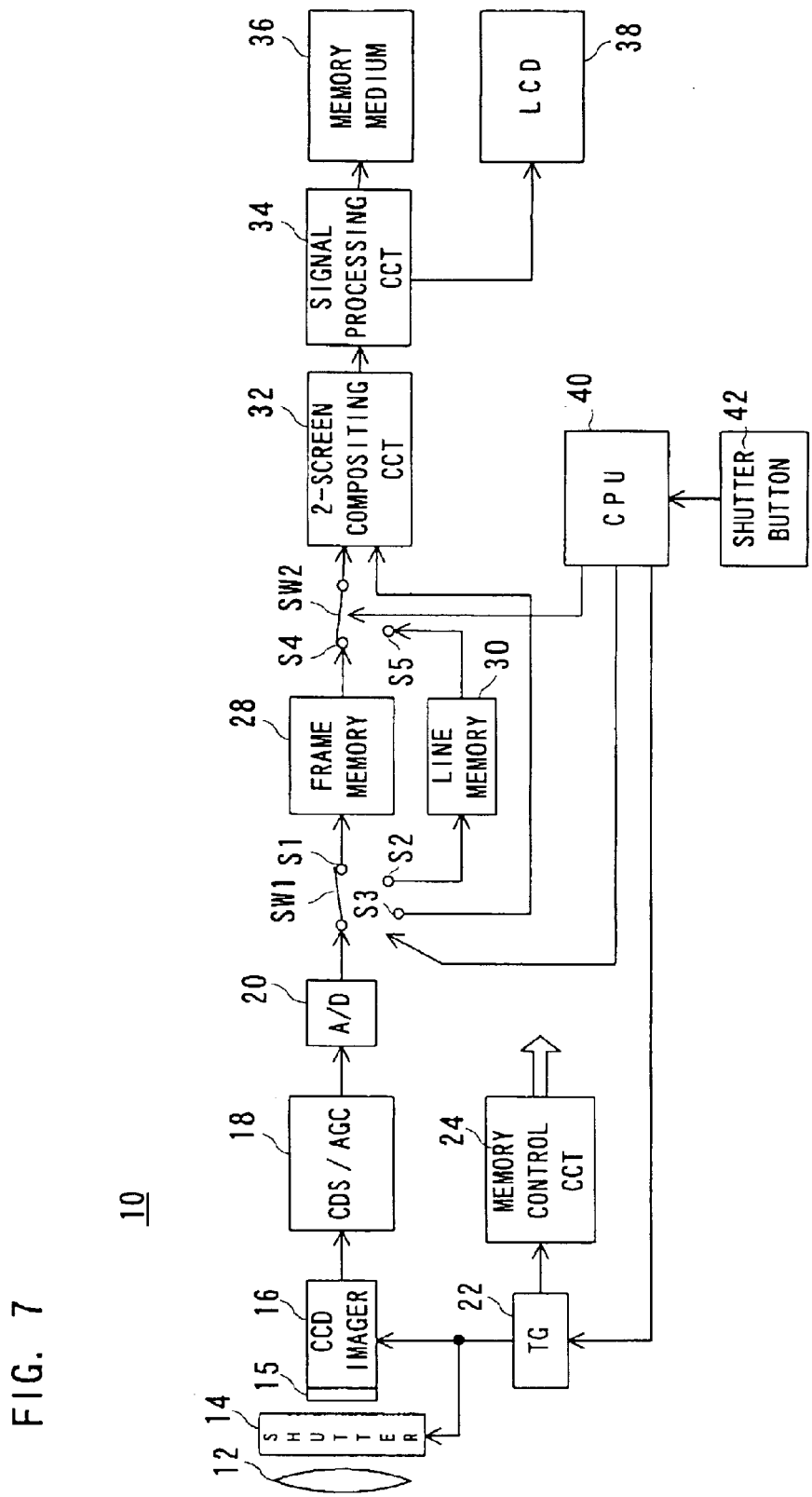
FIG. 7 is a block diagram showing another embodiment of the present invention.
Figure 8:
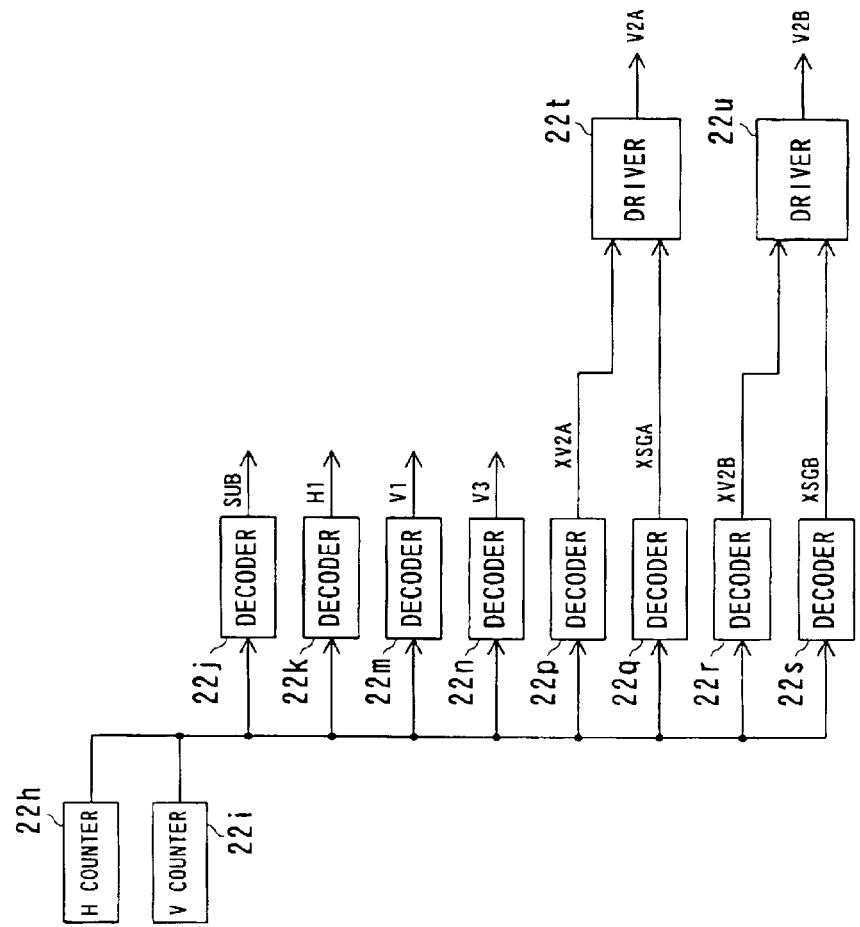
FIG. 8 is a block diagram showing one part of a timing generator applied to the FIG. 7 embodiment.
Figure 11:
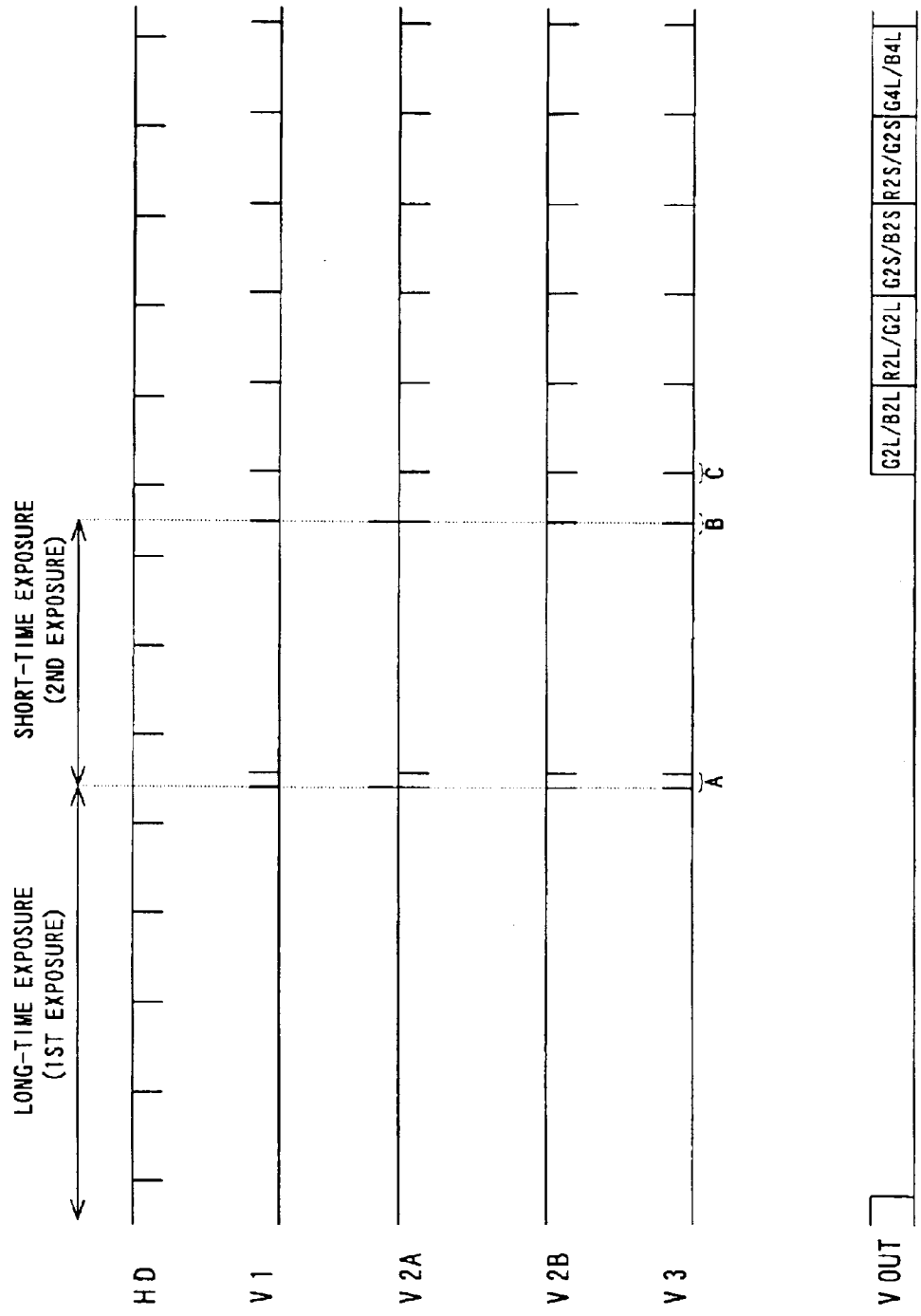
FIG. 11 is a timing chart showing one part of operation in the camera mode.

Referring to FIG. 7, a digital camera 10 of another embodiment has a TG 22 to which a TG shown in FIG. 8 is applied. In a camera mode, a first camera signal and second camera signal having 1280 pixels×480 lines are read from the CCD imager 16. The line memory 30 has a capacity of 2 lines. The 2-screen compositing circuit 34 creates composite camera data of 1280 pixels×480 lines from first camera data outputted from the line memory 30 and second camera data outputted from the A/D converter 20. Furthermore, the signal processing circuit 34 creates image data of 640 pixels×480 lines based on the composite camera data of 1280 pixels×480 lines, and supplies it to the LCD 38. As a result, through-images are displayed on the LCD 38 which is broadened in dynamic range in a pseudo fashion.

Referring to FIG. 8, the TG 22 includes an H counter 22h and a V counter 22i. The H counter 22h is to count the number of horizontal pixels. A horizontal count value is reset in response to a horizontal sync signal and decremented responsive to a pixel clock. On the other hand, the V counter 22i is to count the number of vertical lines. A vertical count value is reset in response to a vertical sync signal and incremented responsive to a horizontal synchronizing signal. Both the horizontal and vertical count values are delivered to the decoders 22j–22s.

The decoder 22j creates a charge sweep pulse SUB based on these count values. Also, the decoder 22k creates a horizontal transfer pulse H1(H1 pulse) from the input count values. The decoders 22m and 22n create a vertical transfer pulse V1 (V1 pulse) and vertical transfer pulse V3 (V3 pulse) from the count values. Furthermore, the decoders 22p–22s respectively create timing pulses XV2A, XSGA, XV2B and XSGB. Among them the timing pulses XV2A and XSGA are delivered to a driver 22t, while the timing pulses XV2B and XSGB are given to a driver 22u. The drivers 22t and 22u respectively create a vertical transfer pulse V2A (V2A pulse) and a vertical transfer pulse V2B (V2B pulse) based on the given timing pulses. Incidentally, FIG. 8 shows only the blocks related to the camera mode.

As stated before, each light emitting element 16a of the CCD imager 16 correspond to three metals. The vertical transfer pulses VI, V3, V2A and V2B outputted from the TG 22 are applied to the respective metals in a manner shown in FIG. 9 and FIG. 10. That is, considering three metals assigned to each light receiving element 16a, a VI pulse is applied to an uppermost metal and a V3 pulse is to a central metal. A V2A or V2B pulse is applied to a lowermost vertical transfer pulse. The ones to which the VIA and V2B pulses are applied are switched every 2 pixels. That is, FIG. 9 shows pixels on an odd numbered column. On the odd numbered column, for the vertically continuing R pixel, G pixel, R pixel and G pixel, a V2A pulse is supplied to the upper half, i.e. the R pixel and G pixel while a V2B pulse is given to the lower half, i.e., the R pixel and G pixel. FIG. 10 shows pixels on an even numbered column. Herein, a V2A pulse is supplied to the G pixel and B pixel as the upper half of continuing 4 pixels while a V2B pulse is given to the lower half G pixel and B pixel.

Figure 12:
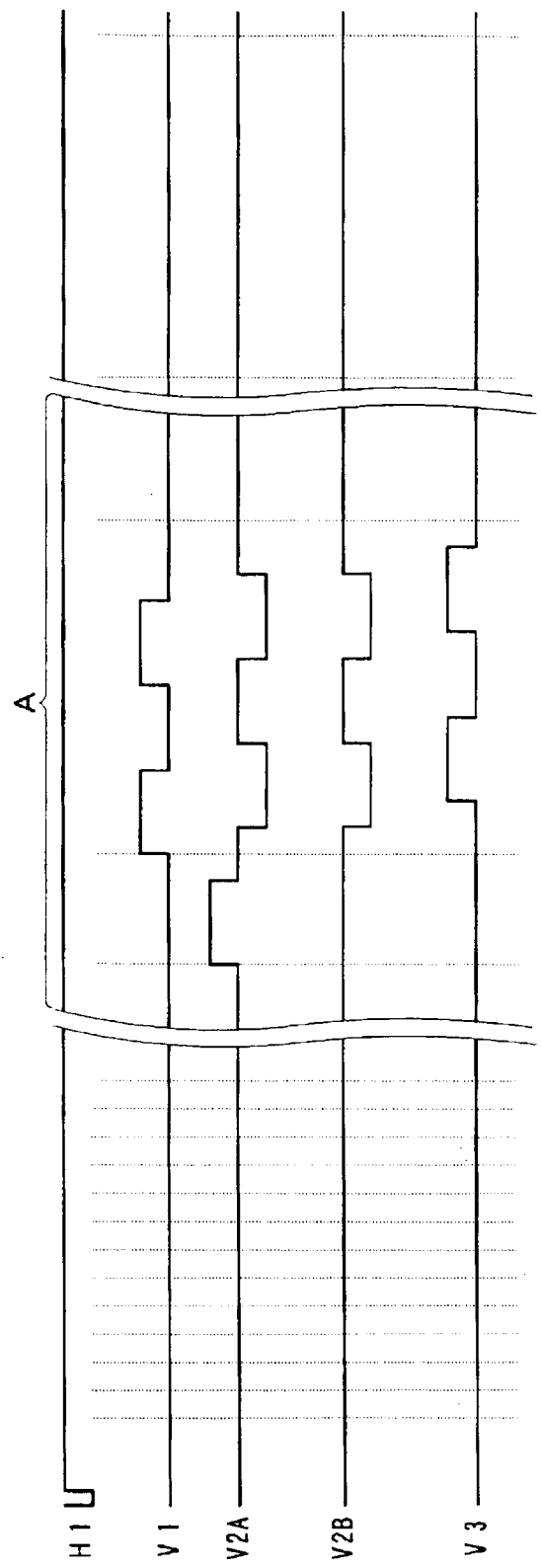
FIG. 12 is a detailed timing chart for a period A shown in FIG. 11.

Explanation will be made on the output timings of the vertical transfer pulses VI, V3, V2A and V2B with reference to FIG. 11 to FIG. 14. In a duration A immediately after conducting long-time exposure (first exposure) shown in FIG. 11, the respective pulses vary as shown in FIG. 12. When the V2A pulse becomes a plus in level, the first charge on a corresponding pixel is read onto the vertical transfer register 16b. After read out, the VI and V3 pulses assume twice a pulse level in different timing from each other. Also, the V2A and V2B pulses simultaneously assume twice a minus level. As a result of this, the first charge is vertically moved by 2 lines.

According to FIG. 9, respective charges R4L and G4L are read from the pixels R4 and G4 while respective charges R2L and G2L are read from the pixels R2 and G2. The read charges R4L, G4L, R2L and G2L are vertically moved by 2 lines. Also, according to FIG. 10, respective charges G4L and B4L are read from the pixels G4 and B4 while respective charges G2L and B2L are read from the pixels G2 and B2. The charges G4L, B4L, G2L and B2L are also vertically moved by 2 lines.

The pixels (light receiving element) to be read are only the upper-half 2 pixels among vertically continuing 4 pixels, and the lower-half 2 pixels are not to be read. That is, the light receiving elements to be read intermittently exist every 2 pixels, and the number of pixels of a lacking portion is also 2 pixels. Consequently, due to the afore-said 2-lines movement the charge is positioned to a vacant transfer region.

Figure 13:
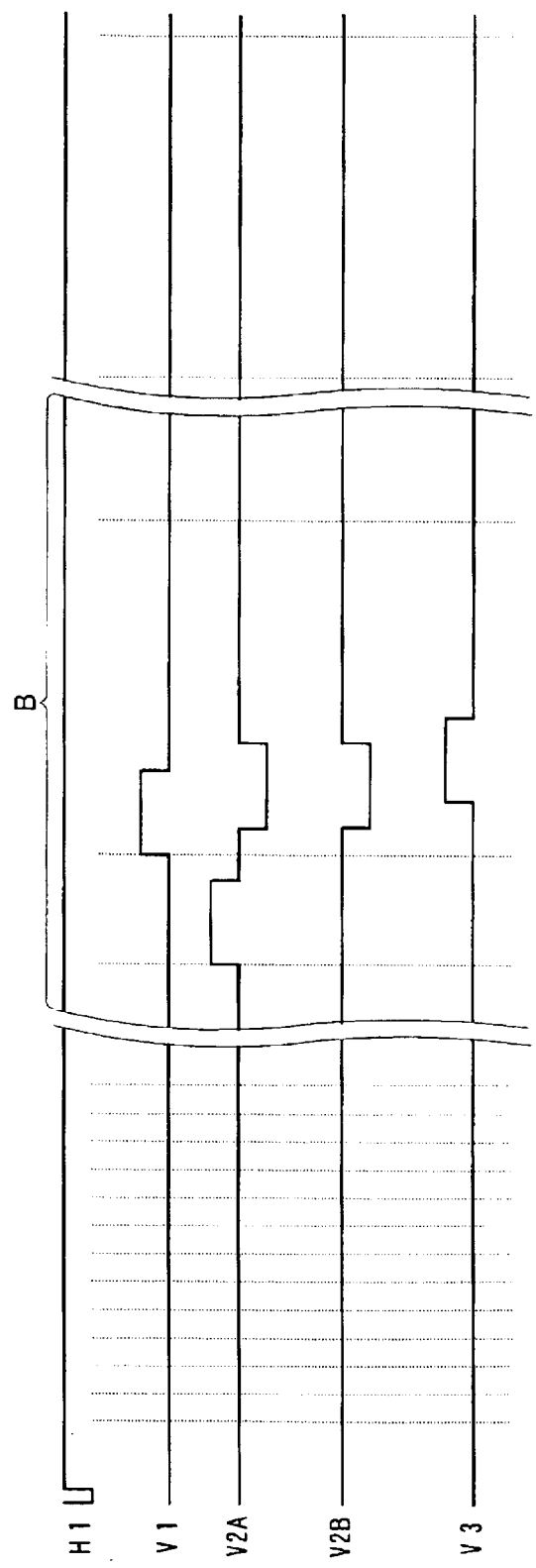
FIG. 13 is a detailed timing chart for a period B shown in FIG. 11.

Short-time exposure (second exposure) is started immediately after reading out the charge in the period A. As a result of this, the charge is again accumulated on each light receiving element 16a. In a period B beginning from the completion of short-time exposure, the pulses vary as shown in FIG. 13. First, the V2A pulse becomes once a plus level, and the charge on a corresponding pixel is read onto the vertical transfer register 16b. On an odd numbered column shown in FIG. 9, respective charges R4S and G4S are read out of adjacent pixels R4 and G4, and respective charges R2S and G2S are read from the pixels R2 and G2 adjacent through a distance of 2 pixels. On the other hand, on an even numbered column shown in FIG. 10, respective charges G4S and B4S are read out of adjacent pixels G4 and B4, and respective charges G2S and B2S are read from the pixels G2 and B2 adjacent through a distance of 2 pixels.

The charge read out during the period A (first charge), at a time point of short-time exposure completion, has vertically moved by 2 lines. Thus, the charge read out during the period B (second charge) is not mixed with the charge read during the period A. The first and second charges thus read exist on a 2-pixel basis with respect to the vertical direction. That is, according to FIG. 9, the first and second charges exist in a form of R4S, G4S, R4l, G4L . . . According to FIG. 10, the first and second charges exist in a form of G4S, B4S, G4l, B4L . . . .

Referring back to FIG. 13, after the second charge has read onto the vertical transfer register 16b, the V1 and V2 pulses assumes only once a plus level in different timing while the V2A and V2B pulses simultaneously assume once a minus level. Due to this, the charges existing on the vertical transfer register 16b (first and second charges) are vertically transferred by 1 line.

Figure 14:
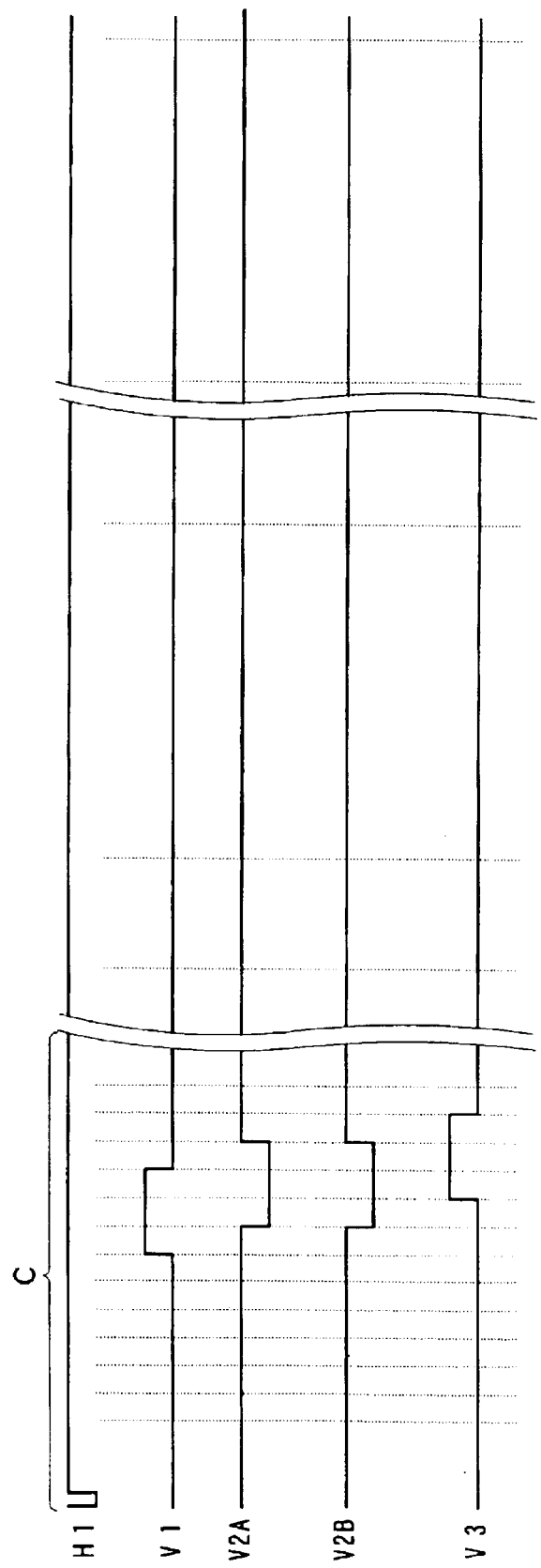
FIG. 14 is a detailed timing chart for a period C shown in FIG. 11.

In the period C the pulses vary as shown in FIG. 14. First, the VI pulse becomes once a plus level, and then the V2A and V2B pulses simultaneously become once a minus level. Thereafter, the V3 pulse becomes once a plus level. As a result of this, the charge on the vertical transfer register 16b is vertically transferred by 1 line. That is, the first and second charges are vertically transferred each 2 lines in a coexisting fashion. Thereafter, vertical transfer pulses VI, V2A, V2B and V3 are outputted in a procedure as shown in FIG. 14, and the charge on each line is transferred toward the horizontal transfer register 16c.

Incidentally, charge sweep pulses SUB are outputted once per each start of the first exposure and second exposure, and further continuously outputted from an end of the second exposure to a start of the next first exposure.

The first or second charge delivered to the horizontal transfer register 16c is then horizontally transferred by an HI pulse and outputted line by line from the CCD imager 16. At this time, a first camera signal continues over a 2-line period, and subsequently a second camera signal continues over a 2-line period. The switch SW1 is switched between the terminals S2 and S3 every 2-line period. As a result of this, the first camera data outputted from the A/D converter 20 is supplied to the 2-screen compositing circuit 42 via a line memory 30. Similarly, the second camera data outputted from the A/D converter 20 is given as it is to the 2-screen compositing circuit 32. That is, first and second camera data related to each other are simultaneously inputted to the 2-screen compositing circuit 32.

The 2-screen compositing circuit 32 composites the simultaneously-inputted first and second camera data to create composite camera data having a dynamic range broadened in a pseudo fashion. The created composite camera data has pixels in number of 1280 pixels×480 lines. A signal processing circuit 34 creates image data of 640 pixels×480 lines, based on the composite camera data. The created image data is sent to an LCD 38. As a result, through-pictures are displayed on the screen.

According to these embodiments, in the camera mode first and second exposures are carried out by the electronic shutter scheme. The first charge created by the first exposure is read from the vertically-intermittent light receiving elements to the vertical transfer registers. The second charge created by the second exposure is also read from the vertically-intermittent light receiving elements to the vertical transfer registers.

Here, the light receiving element from which the first charge is to be read out is the same as the light receiving element that the second charge is to be read out. The first charge is transferred to a vacant transfer region of the vertical transfer register simultaneously with or prior to reading out the second charge. Furthermore, the moving distance of the first charge is equal to or greater than a distance between the light receiving elements to be read out. As a result of this, there is no possibility that the first and second charges be mixed with each other.

Also, when the shutter button is pressed, light incident onto the CCD imager is actually blocked off by the mechanical shutter scheme. This eliminates the necessity to read out the charge immediately after exposure ending. The charges can be held on the light receiving elements. That is, a fourth exposure can be made even while a third camera 5 signal is third exposure. Thus, it is possible to bring close in timing the third exposure and fourth exposure in timing each other. As a result, even where the subject is moving at high speed, blurring is prevented from occurring in the record image.

Incidentally, although in this embodiment explanation was made using a primary color filter having R, G and B arranged in a mosaic form, a complementary color filter may be used which having Ye, Cy, Mg and G arranged in a mosaic form.

Also, in this embodiment the light receiving element from which the first charge is to be read out (first light receiving element) is common to the light receiving element that the second charge is to be read out (second light receiving element). Alternatively, the first light receiving element and the second light receiving element may be different from each other provided that no mixing occur between the first charge and the second charge.

Furthermore, in this embodiment the first exposure period was longer than the second exposure. However, the second exposure period may be set longer than the first exposure period provided that the respective periods are different.

Furthermore, the first exposure and second exposure by the electronic shutter scheme as well as the compositing process with the first and second camera data based on the exposures are implemented only in a camera mode, i.e., a through-image display mode. However, such process is applicable also to a motion-image record mode to record moving images to a recording medium.

Although the present invention has been described and illustrated in detail, it is clearly understood that the same is by way of illustration and example only and is not to of limitation, the spirit and scope of the present invention being limited of the appended claims.

What is claimed is:

1. A digital camera, comprising:
an imager including a vertical transfer register having a plurality of transfer areas, a horizontal transfer register connected to an output terminal of said vertical transfer register, and a plurality of light-receiving elements respectively assigned to said plurality of transfer areas;
a timing generator connected to said imager, and for applying timing signals to said imager, wherein said timing signals include a first exposure signal for carrying out a first exposure of a first time period, a second exposure signal for carrying out after said first exposure a second exposure of a second time period, which is shorter than said first time period, a first reading signal for reading-out from first light-receiving elements intermittently present in a vertical direction out of said plurality of light-receiving elements to said vertical transfer register first electric charges generated by said first exposure, a second reading signal for reading-out from second light-receiving elements respectively assigned to vacant transfer areas in which no electric charge is present out of said plurality of light-receiving elements to said vertical transfer register second electric charges generated by said second exposure, a vertical transfer signal for transferring the electric charges read-out to said vertical transfer register in a vertical direction, and a horizontal transfer signal for transferring in a horizontal direction the electric charges that reaches said horizontal transfer register by a transfer in accordance with said vertical transfer signal, and wherein said second light receiving elements are intermittently present in the vertical direction, and said first electric charges read out by said first reading signal and said second electric charges read out by said second reading signal are alternately arranged on said vertical transfer register; and
a processor for generating one screen of a first image signal based on said first electric charges and said second electric charges output from said imager;
an instruction key for inputting an imaging instruction; and
a shutter member arranged at a front surface of said imager, and for cutting-off an irradiation of light into said imager; wherein said timing signal further includes a third exposure signal output in response to an operation of said instruction key, and for carrying out a third exposure of a third time period, a third reading signal for reading out from said plurality of light-receiving elements to said vertical transfer register third electric charges generated by said third exposure, a second vertical transfer signal for transferring in a vertical direction said third electric charges on said vertical transfer register, a second horizontal transfer signal for transferring in a horizontal direction said third electric charges applied to said horizontal transfer register, a fourth exposure signal for carrying out a fourth exposure after said third exposure, a driving signal output after a fourth time period, which is different from said third time period, has passed since a time of starting said fourth exposure, and for driving said shutter member, a fourth reading signal for reading out fourth electric charges generated by said fourth exposure from said plurality of light-receiving elements to said vertical transfer register after a completion of a vertical transfer of said third electric charges, a third vertical transfer signal for transferring in a vertical direction said fourth electric charges on said vertical transfer register, and a third horizontal transfer signal for transferring in a horizontal direction said fourth electric charges applied to said horizontal transfer register, and said processor generating one screen of a second image signal based on said third electric charges and fourth electric charges output from said imager.

2. A digital camera according to claim 1, further comprising a recorder for recording said second image signal into a recording medium in a compressed state.

3. A digital camera, comprising:

an imager including a vertical transfer register having a plurality of transfer areas, a horizontal transfer register connected to an output terminal of said vertical transfer register, and a plurality of light-receiving elements respectively assigned to said plurality of transfer areas;

an exposure controller for controlling an exposure of said imager by using an electric shutter system;

a reader for reading out from a portion of said plurality of light-receiving elements to said vertical transfer register electric charges generated by an exposure of said exposure controller;

a vertical transferor for transferring in a vertical direction the electric charges read-out to said vertical transfer register by said reader;

a horizontal transferor for transferring in a horizontal direction the electric charges that reach said horizontal transfer register by a transfer of said vertical transferor, wherein said exposure controller carries out a first exposure of a first time period, and carries out after said first exposure a second exposure of a second time period, which is shorter than said first time period, said reader reads out from first light-receiving elements intermittently present in a vertical direction out of said plurality of light-receiving elements to said vertical transfer register first electric charges generated by said first exposure, and reads out from second light-receiving elements respectively assigned to vacant transfer areas in which no electric charge is present out of said plurality of light-receiving elements to said vertical transfer register second electric charges generated by said second exposure, and wherein said second light-receiving elements are intermittently present in the vertical direction, and said first electric charges and said second electric charges read out by said reader are alternately arranged on said vertical transfer register; and a generator for generating one screen of a first image signal based on said first electric charges and said second electric charges output from said imager;

an instruction key for inputting an imaging instruction;

a shutter member arranged at a front surface of said imager, and for cutting-off an irradiation of light into said imager; and a driver for driving said shutter member, wherein said exposure controller carries out a third exposure of a third time period in response to an operation of said instruction key, and starts a fourth exposure after said third exposure, said reader reads out from said plurality of light-receiving elements to said vertical transfer register third electric charges generated by said third exposure, and reads out fourth electric charges generated by said fourth exposure from said plurality of light-receiving elements to said vertical transfer register after a completion of a vertical transfer of said third electric charges, said driver drives said shutter member when a fourth time period, which is different from said third period, has passed since a time of staring said fourth exposure, and said generator generates one screen of a second image signal based on said third electric charges and said fourth electric charges output from said imager.

4. A digital camera according to claim 3, further comprising a recorder for recording said second image signal into a recording medium in a compressed state.

* * * * *